United States Patent [19]

Lewis

[11] Patent Number: 4,517,276
[45] Date of Patent: May 14, 1985

[54] METAL-CONTAINING ORGANIC PHOTORESISTS

[75] Inventor: Carol R. Lewis, Palo Alto, Calif.

[73] Assignee: Varian Associates, Inc., Palo Alto, Calif.

[21] Appl. No.: 445,353

[22] Filed: Nov. 29, 1982

[51] Int. Cl.³ .................. G03C 1/60; G03C 1/72; G03F 7/26

[52] U.S. Cl. .................. 430/192; 430/190; 430/270; 430/296; 430/325; 430/966; 430/967; 430/330; 430/331; 427/43.1

[58] Field of Search .............. 430/296, 270, 192, 190, 430/325, 966, 967; 427/43.1

[56] References Cited

U.S. PATENT DOCUMENTS

| 3,374,094 | 3/1968 | Wainer et al. |
|---|---|---|
| 3,502,470 | 3/1970 | Delzenne et al. ............... 430/190 |
| 3,656,951 | 4/1972 | Anderson et al. |
| 3,954,468 | 5/1976 | Lewis et al. |
| 3,977,874 | 8/1976 | Roteman. |
| 4,086,091 | 4/1978 | Cella. |
| 4,156,745 | 5/1979 | Hatzakis et al. |
| 4,307,178 | 12/1981 | Kaplan et al. |
| 4,332,879 | 6/1982 | Pastor et al. ............... 427/43.1 |
| 4,347,304 | 8/1982 | Sakurai et al. |
| 4,396,704 | 8/1983 | Taylor. |

FOREIGN PATENT DOCUMENTS

| 1367830 | 9/1974 | United Kingdom ............ 430/193 |
|---|---|---|
| 0595694 | 2/1978 | U.S.S.R. ............ 430/325 |
| 687066 | 9/1979 | U.S.S.R. ............ 430/193 |

OTHER PUBLICATIONS

Mochiji et al., *Jap. Journal of Applied Physics*, vol. 20, 1981, pp. 63–67.
Hiraoka et al., *IBM Technical Disclosure Bulletin*, vol. 20, No. 5, 1977, p. 1922.
I. Haller, R. Feder, M. Hatzakis and E. Spiller, J. Electrochem. Soc. 126(1), 154, (1979).
D. J. Webb and M. Hatzakis, J. Vac. Sci. Technol. 16(6), 2008, (1979).

Primary Examiner—Charles L. Bowers, Jr.
Attorney, Agent, or Firm—Stanley Z. Cole; William R. McClellan

[57] ABSTRACT

Photoresist compositions are provided whereby metals are incorporated into the resist by providing a photoresist composition comprising the reaction product of an organic resist which has at least one reactive hydroxyl or amino group with an organometallic compound. Also provided is a process for generating a pattern on a substrate by coating the substrate with a thin film of the photoresist composition which comprises the reaction product of the organic resist which has at least one reactive hydroxyl or amino group with an organometallic compound. The photoresist compositions are particularly suitable for use in diazo-type electron beam procedures.

10 Claims, No Drawings

METAL-CONTAINING ORGANIC PHOTORESISTS

FIELD OF THE INVENTION

This invention relates to photoresist compositions and more particularly to photoresist compositions wherein metals are chemically incorporated into the compositions, and to procedures for use of these photoresist compositions, as in electron beam lithography.

BACKGROUND

The semiconductors industry continues increased interest in electron beam lithography as an alternative to ultraviolet lithography in the manufacture of semiconductor devices. A major advantage of electron beam lithography is in reducing the size of electronic components and circuits. The electron beam technique also offers the advantages of very high resolution, direct writing on the substrate, and lower defect incidences. Direct writing also eliminates alignment or mask substrate contact difficulties. Attainment of such resolution, e.g. greater than 0.5 $\mu$m, without the sacrifice of high sensitivity demands the use of dry development processes such as ion milling, sputter etching, plasma etching, and reactive ion etching. This is especially important in the case of negative resists, where swelling in the presence of wet developing solvents may degrade resolution.

The interest in E-Beam technology has also inspired considerable effort in the development of electron sensitive resists of both the positive and negative type. These resists are polymeric solutions that are spin-coated onto the workpiece, dried by baking and exposed to the electron beam in the desired pattern. Resist development is accomplished by soaking in a solvent or mixture of solvents which dissolves either the irradiated portion (positive resist) or the non-irradiated portion (negative resist). The present invention is concerned with negative resists.

Negative resists are significantly more compatible with dry etching processes than are positive resists. Negative resists themselves vary in their dry etch resistance. In addition, structural characteristics such as strong backbone bonds, aromatic rings, polar functional groups and the presence of metals all decrease the rate at which crosslinked polymers are removed from a surface, e.g., by oxygen plasmas. The presence of aromatics also improves resistance to $CF_4$ and $CF_4/O_2$ plasmas. Commercially-available diazo-type resists contain a cresol-formaldehyde resin (novolac) which displays excellent dry etch resistance. Relatively long exposures, ~$2 \times 10^{-5}$ coul/cm$^2$, however, are required for commercially-available resists such as Shipley AZ-1350J, AZ-1370, and AZ-2400, in order to obtain vertical line profiles (i.e., 90% of original unexposed resist thickness remaining) of 1-$\mu$m wide lines in 1-$\mu$m thick resist. Although this sensitivity is far superior to that of the commonly-used positive resist PMMA, polymethyl methacrylate, (~$8 \times 10^{-5}$ coul/cm$^2$ required), it is inferior to that of other commercially available negative resists such as COP, OEBR-100, SEL-N and KMER. Due to their superior dry etch resistance, it is highly desirable to increase the sensitivity of the diazo-type resists to the 20-keV electrons commonly used.

The incorporation of metals such as Cs, Tl, Ca, Sr, Ba, and Pb, I Haller, R. Feder, M. Katzakis and E. Spiller, J. Electrochem. Soc. 126(1), 154 (1979) and D. J. Webb and M. Hatzakis, J. Vac. Sci. Technol. 16(6), 2008 (1979) into positive resists such as copolymers of methyl methacrylate and methacrylic acid, has previously been found to increase the sensitivity of the polymer to electrons and to x-rays, raise the flow temperature and improve overall chemical etch resistance. The higher the atomic number of the element incorporated, the greater the degree of improvement. The metal ions may serve as inelastic scattering centers, L. F. Thompson, E. D. Feit, M. J. Bowden, P. V. Lenzo and E. G. Spencer, J. Electrochem. Soc. 121, 1500 (1974), reducing the percentage of the electron beam passing unchanged through the organic resist layer. The doping of PMMA with small quantities of MMA—Me$_4$Sn copolymer (up to 2%, volume basis)—has been found to increase the self-development sensitivity eightfold and the contrast by 40%, L. F. Thompson and M. J. Bowden, J. Electrochem. Soc. 120, 1722 (1973) and M. Yamada and S. Hattori, Jpn. J. Appl. Phys. 20(10), 1969 (1981).

As pointed out above, it is known to incorporate metals and metal ions into photoresist compositions. In addition to the literature articles mentioned, U.S. Pat. No. 4,307,178 discloses phenol-formaldehyde Novolak resin/diazo ketone resist layers which have been treated with a magnesium salt to produce a negative pattern. Further, U.S. Pat. No. 3,954,468 discloses a radiation process for producing colored photopolymer systems and indicates in Table 7 various metallo-organic additives which are known to improve electron beam and X-ray response. Additives in this group include triphenylleadbromide, triphenylbismuth, and phenyl mercuric iodide. U.S. Pat. No. 3,594,170 relates to additives for negative photoresists to increase the sensitivity wherein the additives are organometallic compounds, such as dibutyltin maleate. Similar disclosures may be found, for example, in U.S. Pat. Nos. 4,156,745, 3,656,951, 3,374,094, 3,977,874, 4,086,091, and 4,347,304.

In all of these prior art systems, however, the metal incorporated into the photoresist composition is either reacted with the finished photoresist or merely added as an additive material. The present invention provides an improved photoresist composition based on the discovery that such improved compositions are obtained if the polymer from which the photoresist is to be manufactured is prereacted with an organometal compound.

SUMMARY OF THE INVENTION

It is accordingly one object of this invention to provide a negative photoresist composition which provides increased sensitivity.

A further object of the present invention is to provide a negative photoresist composition which comprises the reaction product of an organic resist which has at least one reactive hydroxyl or amino group with an organometallic compound, which resist composition has been found to increase the cross section for energy absorption, thus permitting shorter exposure times to be used in electron beam processes.

A further object of the present invention is to provide methods to increase the sensitivity of organolithographic resists to high energy radiation, for example by electron beams and X-rays.

Other objects and advantages of the present invention will become apparent as the description thereof proceeds.

In satisfaction of the foregoing objects and advantages, there is provided by this invention a photoresist composition, especially for use as an organic lithographic resist to high energy irradiation, the photoresist composition comprising the reaction product of an organic resist which has at least one reactive hydroxyl or amino group with an organometallic compound.

The present invention also provides a process for generating a pattern on a substrate comprising:

(a) coating the substrate with a thin film of a photoresist composition, said composition comprising the reaction product of an organic resist which has at least one reactive hydroxyl or amino group, with an organometallic compound of the formula $R_yMX$, wherein R is alkyl, aryl, arylalkyl, or alkylaryl, M is a metal, X is halogen or OR′ wherein R′ is alkyl and $1 \leq y \leq 4$, depending on M.

(b) exposing areas of the substrate desired to be protected to electrons to insolubilize and crosslink the films in said areas; and (c) dissolving and removing the areas of said film not exposed.

DESCRIPTION OF PREFERRED EMBODIMENT

The present invention is concerned with the discovery that photoresist compositions which have an active functional hydroxy or amino group can be improved if prereacted with an organometallic compound prior to formation of the photoresist composition. It has been discovered that incorporation of metals into photoresist compositions in this manner provides improved results with respect to sensitivity of the resulting photoresist composition and in other areas. This improved sensitivity is especially notable in the formation of organic lithographic resists which are used for high energy irradiation, e.g., by electron beams and X-rays. It has been found that the inclusion of elements such as metals of high atomic number in the resist increases the cross section for energy absorption, thus permitting shorter exposure times to be used. The covalent bonding of the metal to the resist by pre-reaction insures homogeniety in proximity of absorption centers to the radiation sensitive functional groups of the resists.

As noted above, organic resists are known in which metal has been added as a separate component or reacted with the completed resist. Also, positive resists are known into which metals are incorporated by methods other than those described herein, for example, by reaction of a carboxylic acid group with a metal salt, or copolymerization of an organic monomer with a dopant quantity of a metal containing monomer. A good electron resist must have several properties. These are high sensitivity to radiation, good contrast between exposed and unexposed areas, and good resolution. It is also important that the resist should adhere strongly to the substrate and be compatible with subsequent manufacturing processes such as wet chemical etching, plating or lift-off metallization. Since dry etching is becoming more widespread, the mechanical and chemical stability of the polymer at high (150°–300° C.) temperatures must also be satisfactory.

Organic resists which do not contain metal generally are expected to be less sensitive to high energy radiation than are resists which do contain metal. Positive resists generally possess inferior resistance to dry etch processes required for the realization of high resolution patterns. Therefore, their ultimate usefulness is limited by the nature of dry development. For example, polymethylmethacrylate is readily eroded by oxygen plasmas as well as $CF_4$ or $CF_4/O_2$ plasmas. Moreover, its sensitivity threshold is only $8 \times 10^{-5}$ coul/cm². Incorporation of metals into negative resists provides negative resists which possess superior dry etch resistance.

This invention is concerned with the incorporation of metals into negative resists which contain hydroxyl or amino groups or which can be chemically functionalized with hydroxyl or amino groups. The metals are incorporated into the resists by pre-reaction of the polymeric resist containing these functional groups with an organometallic compound. The invention is primarily concerned with resists which contain hydroxyl groups which have been pre-reacted with organometallic halides and this embodiment is also within the scope of the invention. The reaction scheme where the organometallic halide is reacted with hydroxyl proceeds in general as follows:

SCHEME I

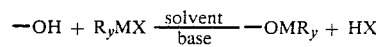

where:
- —OH = resist containing hydroxyl groups
- R = alkyl, aryl, aralkyl, alkaryl
- y = integer, magnitude dependent upon the nature of M
- M = main group or transition metal
- X = halogen After reaction with the organometallic compound, the polymer will contain from about 0.4 wt. % up to about 45.0 wt. % of metal, based on elemental analytical data.

The reaction proceeds in an appropriate solvent or solvent mixture. The presence of a stoichiometric quantity of base, relative to the halide, drives the reaction toward completion by reaction with the hydrogen halide product. A specific example of the reaction is illustrated in the following Scheme II.

SCHEME II

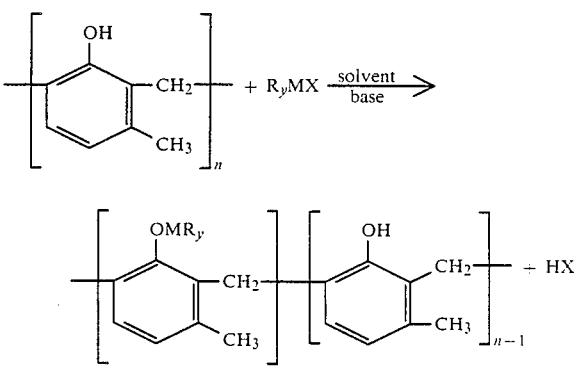

Functional group abbreviations are the same as in Scheme I. For a typical cresol-formaldehyde novolac: n ~ 10.

In this scheme it will be noted that reaction of a cresol-formaldehyde novolac resin, a key component of diazo-type negative resists, is carried out with an organometallic halide. In general the method of the invention is considered applicable to any such halide which is capable of reacting with hydroxyl groups of the resist. The resulting metal functionalized resist, in this case novolac, can be substituted for unfunctionalized resists in any diazo-type resist formulation. The techniques for film preparation, exposure and development are generally the same.

According to the present invention it has been found that preparation of the material to be used as the resist by reaction of a reactive hydroxyl group with an organometallic halide has general applicability for the resist and is generally useful in the production of improved photoresists in these systems.

As will be understood by those skilled in the art, a negative photoresist is any organic material which, when exposed to radiation, will undergo chemical reactions of the type referred to as crosslinking. These reactions result in insolubilization of the exposed photoresist. The crosslinking reactions are of the type that can be initiated either by light or by electrons but in the present invention, it is preferred to use electron beams of substantial energy. Thus the invention is particularly preferred for use in electron beam lithography and the like. The most preferred negative photoresist for use in the compositions and methods of the present invention include the cresol-formaldehyde novolac resins. However, it will be understood that a wide range of negative phororesists may be employed in the present invention. It will also be understood of course that the novolac or cresol-formaldehyde resin is a key component of diazo-type lithographic resists and is not the sole component. The resist would generally comprise a solution admixture of a photoactive component such as an o quinone diazide which may be a napthoquinone diazide and a novolac and a suitable organic solvent or solvent mixture. The chemistry of the exposure processes of resist films in air and vacuum of course are known. Exposure in air converts the napthoquinone diazide into a carboxylic acid possessing enhanced solubility in basic developer solutions. Exposure in vacuum or under anhydrous conditions leads to crosslinking of the polyfunctional polyphotoactive component and novolac, hence to diminished solubility in the developer.

It will therefore be understood that the invention is concerned with provision of a component of the resist which comprises a reaction product of a resin which has a functional reactive group with an organometallic compound as a means of incorporation of the metal into the resist composition. The other features of the resist including the diazide component, solvent and the like, are known in the art as are methods for their use in electron beam lithography.

The polymer or resin to be reacted with the organometallic compound may be generally described by the following formula:

(Resin)—A

In this formula, the polymer or resin is any polymer which contains the reactive group. Suitable resins or polymers are described in U.S. Pat. Nos. 3,201,239, 3,106,465 and 4,007,047. Materials such as polyacrylic acid, polyethylene imine, polyamic acid, polyphosphoric acid, polyvinyl pyridine and polyvinyl alcohol are representative. The reactive group A is preferably hydroxyl as in cresol-formaldehyde resins. However, it may also be amino, alkyl-substituted amino and the like. However, the preferred materials are cresol-formaldehyde polymers such as the novolac polymers.

This is reacted with an organometallic compound of the following formula:

$R_y MX$ wherein R is alkyl, aryl, aralkyl, alkaryl, cycloaliphatic, or heterocyclic of 1 to 30 carbon atoms, M is a metal and X is halogen such as bromo or chloro or OR' wherein R' is alkyl of 1 to 8 carbons, and $1 \leq y \leq 4$. Preferred are organometallic halides where R is alkyl or aryl of 1 to 24 carbon atoms, M is a metal such as a transition metal but inclusive of Sn, Sb, Pb, and Bi. X is preferably halogen, either chlorine or bromine. R is preferably methyl, ethyl, n-propyl, n-butyl, or phenyl. A monohalide should be used to prevent crosslinking the resin. Preferred specific metallic materials which may be used include $Bu_3SnCl$, $Ph_2BiCl$, $Ph_2BiBr$, $Me_3SnCl$, $Ph_3SnCl$, $Et_3PbCl$, $Ph_3PbCl$, $Ph_4SbBr$, where Bu is butyl, Ph is phenyl, Me is methyl, and Et is ethyl.

The reaction of the polymer or resin with the organometallic compound proceeds readily in the presence of a solvent and a base. The amount of base should be stoichiometric relative to the amount of halide contained in the reaction. A preferred solvent is tetrohydrofuran and it is preferred to carry out the reaction in an inert atmosphere such as under nitrogen unless the reaction is air and water stable. The base employed is preferably an amine such as a monoalkyl, dialkyl or trialkylamine, such as triethylamine. The reaction may be carried out at any desired temperature but preferably at about 20°-50° C., preferably ambient temperature.

The metal-reacted resin is then precipitated from the solvent, preferably at low temperatures, by addition of a non-solvent such as an aliphatic hydrocarbon, and then washed. The percentage of metal contained in the resin as a result of the reaction may be determined by standard analytical concepts as by atomic absorption spectrophotometry. As pointed out, the resin should contain from about 0.4 to 45.0 wt. % of metal based on the wt. % of the resin. After reaction with the organometallic compound, the resin should still contain about 58 to 99% of available hydroxyl sites.

The resins generally used in the photoresist compositions are available commercially and are known in the art prior to reaction with the organometallic compound. The organometallic compounds are to some extent available commercially but are easily prepared if not available commercially. For example, the organometallic compound may be prepared in situ. Thus, the compounds $Ph_2BiCl$ and $Ph_2BiBr$ are prepared by the reaction of commercially available $BiCl_3$ or $BiBr_3$, respectively. The $Ph_2BiCl$ or $Ph_2BiBr$ is isolated and purified prior to reaction with the resin.

As indicated above, the resulting resin, which is the reaction product of the organic resin material and the organometallic compound, is utilized in diazo-type resists. These diazo-type resists generally consist of a solution of a diazide as the photoactive component, and a resin such as a novolac resin in a suitable organic solvent or solvent mixture. This composition can then be employed in electron beam lithography in the production of microcircuitry by electron beam lithography. In general, this process comprises generating a pattern on a substrate, and coating the substrate with a thin film of the photoresist composition as described above. To provide the desired pattern, certain areas of the composition are then protected and the remaining areas are exposed to electrons. Using a negative resist, the areas of the film which are not exposed are dissolved and removed in the developing step of the process. This procedure is known in the art and is described for example in U.S. Pat. No. 4,262,083 and throughout the literature.

The polymeric materials employed in the present invention are normally coated on a substrate from a solution of the polymeric material in any suitable manner such as by spin casting or dipping, and then dried to remove the volatile matter. The solution of polymeric material should be compatible with the substrate. The solvents employed should have boiling points below the decomposition point of the polymeric material employed in order to permit removal of the solvent from the cast film by heating. Exemplary of some suitable solvents are ethyl cellosolve acetate, chlorobenzene, liquid saturated, carboxylic acids, halogenated hydrocarbons, e.g., chlorobenzene, ketones e.g. methyl ethylketone, cellosolves, Dimethyl formamide, Dimethyl sulfoxide, tetrahydrofuran.

The determination of a specific solvent system for a particular polymeric material primarily depends upon the chemical identity of the polymeric material and upon the molecular weight and is readily ascertainable as known in the art.

The polymeric films can be cast in various thicknesses and particularly from about 1000 angstroms to about 2 microns. The particular thickness will depend upon the type of processing to be employed. For instance 0.5 to 2 microns is generally desirable for etch processing whereas from about 1.0 to about 3 microns is generally used for lift off metallurgical processing.

In addition, it is preferred to prebake the polymeric material film in air or in vacuum at a temperature generally above the glass transition temperature of the polymeric material but below the thermal decomposition temperature thereof. The prebaking is intended to remove trace amounts of the solvent employed in the coating step and also to anneal out strains in the polymeric film. Some exemplary prebake temperatures are about 70° C. to about 250° C. with the preferred temperature range for prebaking being from about 140° C. to about 200° C.

Various substrates can be employed as supports for the polymer resist of the present invention. For example, an application of the polymer resist in the fabrication of semiconductor devices, or integrated circuits, the substrate can comprise semiconductor wafers of chips overcoated with oxides and nitrides such as silicon oxide/silicon nitride for diffusion masks and passivation steps for forming contacts and conductor patterns on the semiconductor chip.

After the polymeric film is dried it is exposed to a pattern defining electron beam radiation to delineate the necessary pattern required in the processing such as in integrated circuits. The enhanced sensitivity of the polymeric materials in conjunction with the appropriate developers render such particularly useful for a process employing a low dose electron beam radiation. The specific exposure flux will normally be dependent upon the particular polymeric material selected and upon the thicknesses of the polymeric resist. Generally, for exposure of the polymer material in thicknesses of about 1000 angstroms to about 10 microns, electron beam radiation from $10^{-6}$ coulombs/cm$^2$ to about $10^{-3}$ coulombs/cm$^2$ and preferably from about $10^{-5}$ to about $10^{-4}$ coulombs/cm$^2$, and at an accelerating potential in the range from about 1 to above 50 kv and preferably from about 10 to 30 kv are employed.

After exposure, the exposed portions of the polymeric film (the degraded products of lower molecular weight) are removed with a suitable solvent which has a different solubility for the non-irradiated and irradiated areas of the polymer resist.

The non-irradiated portions are generally removed with the solvent at temperatures in the range of from about 10° C. to about 100° C. Generally the development time ranges from about 1 to about 60 minutes and preferably between about 5 and 15 minutes. Of course, the development time can be altered by such factors as the particular polymeric material employed, the thickness of the film, the particular solvent system employed, the particular temperature employed for the development step and the exposure dose.

Various types of solvent systems or developing processes can be used. For instance, a solvent system which is a good solvent for both the exposed and unexposed polymers can be employed when particularly fast processes are desirable. In such a system, the thickness of the polymeric material is adjusted so that the remaining unexposed film is thick enough to protect the substrate during subsequent treatment.

Also, if desired, a solvent system which is only a solvent for the exposed areas can be used in the development. Another means of development is to employ a mixture of a solvent capable of dissolving the polymeric material regardless of its molecular weight and a liquid which is incapable of dissolving the polymeric material regardless of its molecular weight in proportions sufficient to dissolve only the exposed portions.

Some examples of suitable solvents developers include methyl ethyl ketone, liquid carboxylic acids, ketones, cellosolves, chlorinated hydrocarbons e.g. chlorobenzene, chloroform, Dimethyl formamide, Dimethyl Sulfoxide or mixtures of the above or mixture with water or alcohols or other organic solvents or nonsolvents e.g. hexane, petroleum ether, alkanes etc.

The pattern resist image may be postbaked to remove the developer solvents. Normally the temperatures used should be below the melting point or glass transition temperature of the polymeric film. Generally the temperature of postbaking is from about 130° C. to about 160° C.

In the present invention, this general process for conducting electron beam lithography is carried out except that the photoresist composition contains a resin which has been prereacted with the organometallic compound as described. It has been found that the incorporation of this amount of metal in accordance with the procedures of this invention results in negative electron beam resists of improved sensitivity.

The following examples are presented to illustrate the invention but it is not to be considered as limited thereto. In the examples and throughout the specification, parts are by weight unless otherwise indicated.

EXPERIMENTAL SECTION

Materials

The organometal halides (and their precursors, in the case of Bi) were obtained commercially and used as received: Bu$_3$SnCl, Et$_3$PbCl, Ph$_3$PbCl and Ph$_4$SbBr (Alfa-Ventron); Ph$_3$PbBr (Strem Chemicals), Ph$_2$BiCl and Ph₂BiBr, which are not commercially available, were prepared by a modification of the literature procedure of Gilman et al, Chem. Rev. 30, 281 (1942) from Ph₃Bi and either BiCl₃ or BiBr₃. 37% HCHO in water (J. T. Baker) and m-cresol (Aldrich 99+% Gold Label) were used as received.

When applicable, air- or water-sensitive materials were handled under $N_2$ in a glove box (Vacuum Atmospheres HE-43-2) or by standard Schlenk techniques. Tetrahydrofuran (THF) or hexane were distilled under $N_2$ from Na/benzophenone, when applicable. Infrared spectra were recorded in KBr disks, using a Perkin-Elmer Model 457 spectrophotometer.

EXAMPLE 1

Preparation of Novolac

A modification of the literature procedure was used (Kentzen, "Phenolic Resins" in *Encyclopedia of Polymer and Technology*, N. M. Bilkalas, Ed. Vol. 10, Interscience, NY (1969). 30 ml m-cresol and 18.3 ml HCHO solution (molar ratio HCHO/m-cresol=0.85) were acidified to pH 1 with 1 ml concentrated HCl. The mixture was heated in a flask fitted with a reflux condenser for 3 hrs. at 80°–85° C. $H_2O$ was distilled out under vacuum (40° C., 0.05 Torr) from the semisolid product, leaving a sticky light beige solid which was washed with hexanes (to remove residual m-cresol) and dried 18 hrs. under vacuum. The resultant brittle beige solid was characterized by its infrared spectrum (KBr disk) consistent with the structure (I). Elemental analysis: Calc for 100% novolac: C 79.97, H 6.71, O 13.32. Calc for 93.9% novolac, 6.1% $H_2O$: C 75.09, H 6.97, O 17.93. Found: C 75.38, H 7.01, O 17.61.

Key infrared bands and their assignments are listed in Table I.

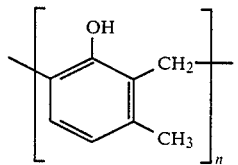

(I)

TABLE I

Assignments of Key Infrared Bands in the Spectrum of Unfunctionalized Novolac

| IR Band Position (cm⁻¹)[1] | |
|---|---|
| 3400–3300 vs, br | O—H (phenolic) of polymer |
| 3020 w | aromatic C—H stretch |
| 2920m, 2860w | aliphatic C—H stretch |

TABLE I-continued

Assignments of Key Infrared Bands in the Spectrum of Unfunctionalized Novolac

| IR Band Position (cm⁻¹)[1] | |
|---|---|
| 1620 sh, 1585 vs, 1495 vs, 1445 vs | aromatic C—C in-plane skeletal vib. |
| 1465 sh | aliphatic - $CH_2$ - (Scissor bend) |
| 1460 vs | asymm. - $CH_3$ bend |
| 1375 mw | symm. - $CH_3$ bend |
| 1330 mw | CO—H bend (phenol) |
| 1185 vs | C—OH bend (phenol) |

[1] vs = very strong; s = strong; m = medium; mw = moderately weak; w = weak; sh = shoulder; br = broad.

EXAMPLE 2

Functionalization of Novolac Resin with Organometal Halides

The preparation of a novolac functionalized with $Et_3Pb$— is described here. Analogous procedures were used for the other reagents, except performed in air if the organometal halide were air- and water-stable. $Et_3PbCl$ (0.55 g, $1.67 \times 10^{-3}$ mole, sufficient to react with 14.9% of the —OH sites) was dissolved in 10 ml dry THF under $N_2$. A solution of 1.0 g novolac in 10 ml dry THF/0.23 ml $Et_3N$ ($1.65 \times 10^{-3}$ mole) was added, under $N_2$. The solution was opened up to air and reduced to ¼ its initial volume. A fivefold excess of hexanes was added to precipitate the functionalized novolac. The novolac was collected by filtration at −78° C., washed with toluene and hexanes (to remove residual $Et_3PbCl$) and with $CH_2Cl_2$ and $H_2O$ to remove $Et_3NH^+Cl^-$. The novolac was then redissolved in a minimum volume of THF and reprecipitated with a fivefold excess of hexanes. The product was filtered off at −78° C. and dried overnight under vacuum (25° C., 0.05 Torr) to a crumbly, brittle, light beige solid. The infrared spectrum was recorded (KBr disk) and the percentage of metal in the novolac determined by atomic absorption spectrophotometry (Stanford University Microanalytical Laboratory, Palo Alto, CA), or Galbraith Laboratories (Knoxville, TN). Different degrees of functionalization were performed, the molar ratio of organometal halide to —OH sites on the novolac ranging from 0.149 to 0.745.

EXAMPLE 3

Reaction of Other Organometal Halides with Novolac

Experimental conditions for functionalization of Novolac of Example 1 with other organometal halides and the percentage of metal in the resulting novolacs are detailed in Table 2.

TABLE II

Functionalization of Novolacs with Organometal Halides

| Organometal Halide | Function Introduced | g Halide/ g Novolac | Wt % Metal in product[2] | Theor. % —OH Sites Reacted | Actual % —OH Sites Reacted |
|---|---|---|---|---|---|
| $Me_3SnCl$ | $Me_3Sn$— | 0.332 | 1.8 | 14.9 | 2.31 |
| | | 1.66 | 23.4 | 74.5 | 29.5 |
| $Bu_3SnCl$ | $Bu_3Sn$— | 0.542 | 0.5 | 14.9 | 0.75 |
| | | 2.71 | 15.51 | 74.5 | 27.8 |
| $Ph_3SnCl$ | $Ph_3Sn$— | 0.642 | 1.0 | 14.9 | 1.60 |
| $Ph_4SbBr$ | $Ph_4Sb$— | 0.849 | 5.8 | 14.9 | 9.80 |
| $Et_3PbCl$ | $Et_3Pb$— | 0.549 | 3.5 | 14.9 | 3.02 |
| | | 1.89 | 40.65 | 51.2 | 42.2 |
| $Ph_3PbCl$ | $Ph_3Pb$— | 0.789 | 4.4 | 14.9 | 4.41 |
| $Ph_3PbBr$ | $Ph_3Pb$— | 0.822 | 5.0 | 14.9 | 5.01 |
| $Ph_2BiCl$ | $Ph_2Bi$— | 0.633 | 14.3 | 14.9 | 13.2 |

TABLE II-continued

| Functionalization of Novolacs with Organometal Halides | | | | | |
|---|---|---|---|---|---|
| Organometal Halide | Function Introduced | g Halide/ g Novolac | Wt % Metal in product[2] | Theor. % —OH Sites Reacted | Actual % —OH Sites Reacted |
| Ph$_2$BiBr | Ph$_2$Bi— | 0.737 | 14.3 | 14.9 | 13.2 |

[1]Initial reaction mixture proportions.
[2]Based on elemental analytical data: weight %.

The infrared spectra of the functionalized novolacs are consistent with replacement of —OH by —OMR$_y$. In general, the decline of the bands associated with —OH (See Table I) are accompanied by increases in the intensities of the bands associated with aliphatic or aromatic C—H. In the case where R=Ph, the appearance of two bands near 750-700 cm$^{-1}$ is characteristic of a monosubstituted phenyl group (Ph$_3$Sn—730 m, 695 mw; Ph$_3$Pb—725 m, 690 mw; Ph$_4$Sb—735 m, 690 mw; Ph$_2$Bi—730 m, 695 mw). In the case where R=alkyl, increased absorbance is observed at 1470 cm$^{-1}$ (CH$_2$ scissor bend), 1460 cm$^{-1}$ (—CH$_3$), and 1375 cm$^{-1}$ (—CH$_3$). In all cases, the ratio of —OH to C—H absorbances in the 3700-2700 cm$^{-1}$ region may be used to estimate the extent of —OH replacement. FIGS. 1 and 2 illustrate the changes in this infrared region as —OH (unfunctionalized novolac) is replaced by Ph$_4$Sb—, Ph$_2$Bi—, Bu$_3$Sn— and Et$_3$Pb—.

Comparison of the theoretical and actual yields for the various metals (Table II) reveals a metal-halogen reactivity order (ease of hydrolysis): Sn—X<Pb—X-<Sb—X<Bi—X. The yields, for the complexes studied, were relatively independent of the nature of Cl or Br. For negative resist activity to be maintained, an appreciable quantity of —OH must remain unreacted, or crosslinking of the novolac upon irradiation of the resist would be severely hindered. As Table II indicates, the percentage of —OH sites reacted with organometallic halide was varied over a wide range, 0.75% to 42.2%.

The invention has been described herein with reference to certain preferred embodiments. However, as obvious variations thereon will become apparent to those skilled in the art, the invention is not to be limited thereof.

I claim:

1. An electron beam sensitive negative photoresist composition having improved radiation sensitivity and requiring shortened exposure time comprising a cresol formaldehyde resin which has been pre-reacted with an organometallic halide of the formula:

R$_y$MX wherein R is an alkyl or aryl, M is a metal, and X is a halogen, and 1<y<4.

2. A composition according to claim 1 wherein R is alkyl or aryl of 1 to 24 carbon atoms, M is a transition metal, X is chloro or bromo and y is 3.

3. A composition according to claim 2 wherein M is Sn, Bi, Sn or Pb and R is methyl, ethyl, n-propyl, n-butyl or phenyl.

4. A composition according to claim 3 wherein the resin is a cresol novolac resin.

5. An electron beam sensitive negative photoresist composition which possesses negative photoresist properties having improved radiation sensitivity and requiring shortened exposure time comprising in admixture:
(a) the pre-reaction product of an organic resist resin which has a reactive hydroxyl group and an organometallic halide compound of the formula:

R$_y$MX wherein R is an alkyl, aryl, alkaryl, or aralkyl group, M is a metal, X is a halogen, and 1<y<4 wherein the organic resist resin which has been pre-reacted with the organometallic halide compound contains 0.4-45 weight percent of metal based on the weight percent of the resin and contains at least 50-99 percent available hydrogen sites after reaction with said organometallic compound,
(b) an o-quinone diazide, and
(c) an organic solvent.

6. A composition according to claim 1 wherein the o-quinone diazide is naphthoquinone diazide.

7. A composition according to claim 1 wherein the organic resist is of the following formula:

(Resin)-A wherein the resin is any organic resin which possesses negative photoresist properties and A is one or more hydroxyl groups.

8. A method for the preparation of a negative electron beam sensitive photoresist of claim 1 having improved rediation sensitivity and requiring shortened exposure time which comprises
(a) the reaction of a negative photoresist resin which contains free hydroxyl groups with an organometallic halide compound of the formula:

R$_y$MX wherein R is an alkyl, aryl, alkaryl, or aralkyl group, M is a metal, X is halogen, and 1<y<4, and
(b) mixing with an o-quinone diazide and an organic solvent.

9. A method according to claim 8 wherein the reaction is conducted in the presence of a solvent and a base.

10. A method according to claim 9 wherein the resin is a cresol-formaldehyde resin and the organometallic compound of the formula:

R$_y$MX wherein R is alkyl or aryl, M is a transition metal, and X is chloro or bromo.

* * * * *